(12) United States Patent
Smith

(10) Patent No.: US 6,295,025 B1
(45) Date of Patent: Sep. 25, 2001

(54) SYSTEM FOR MEASURING AND DISPLAYING THREE-DIMENSIONAL CHARACTERISTICS OF ELECTROMAGNETIC WAVES

(75) Inventor: Stephen H. Smith, Leucadia, CA (US)

(73) Assignee: Smith Technologies Development, LLC, San Diego, CA (US)

( * ) Notice: Subject to any disclaimer, the term of this patent is extended or adjusted under 35 U.S.C. 154(b) by 0 days.

(21) Appl. No.: 09/436,531

(22) Filed: Nov. 9, 1999

Related U.S. Application Data
(60) Provisional application No. 60/145,751, filed on Nov. 9, 1998.

(51) Int. Cl.[7] ........................................ H01Q 3/00
(52) U.S. Cl. ............................................. 342/360
(58) Field of Search ..................... 342/360; 702/57, 702/66, 67

(56) References Cited

U.S. PATENT DOCUMENTS

| | | | |
|---|---|---|---|
| 4,620,192 | 10/1986 | Collins | 342/128 |
| 4,739,330 | 4/1988 | Lazarus | 342/122 |
| 4,860,014 | 8/1989 | Shores et al. | 342/105 |
| 4,958,161 | 9/1990 | Allezard | 342/122 |
| 6,161,018 | * 12/2000 | Reed et al. | 455/456 |

OTHER PUBLICATIONS

Preliminary measurement results from an adaptive antenna array testbed for GSM/UMTS, Mogensen, P.E.; Pedersen, K.I.; Leth–Espensen, P.; Fleury, B.; Frederiksen, F.; Olesen, K.; Larsen, S.L., IEEE 47th Vehicular Technology Conference, , vol.: 3, pp. 1592–1596, Mar. 1997.*

* cited by examiner

*Primary Examiner*—Thomas H. Tarcza
*Assistant Examiner*—Fred H. Mull
(74) *Attorney, Agent, or Firm*—Kenyon & Kenyon

(57) ABSTRACT

A measurement system includes a receiver system and a display system. The receiver system receives one or more electromagnetic (EM) waves each having a carrier frequency and a rotation frequency. The receiver system determines an amplitude for each EM wave. The display system displays the amplitude for each EM wave as a function of carrier frequency and rotation frequency. Another measurement system measures and displays the angular position or orientation and amplitude of the E-field of a received EM wave as a function of time.

13 Claims, 6 Drawing Sheets

SYSTEM FOR MEASURING AND DISPLAYING THREE-DIMENSIONAL CHARACTERISTICS OF ELECTROMAGNETIC WAVES

CROSS-REFERENCE TO RELATED APPLICATIONS

This application claims the benefit under 35 U.S.C. §119 (e) of U.S. Provisional Application No. 60/145,751, filed Nov. 9, 1998.

This application is related to the subject matter of U.S. application Ser. No. 09/064,525, filed on Apr. 23, 1998 entitled "Communications System," (hereinafter, the "copending application") incorporated by reference herein.

This application is related to the subject matter of the following U.S. applications filed concurrently: U.S. application Ser. No. 09/436,236 entitled "Adjustable Balanced Modulator," U.S. application Ser. No. 09/436,763 entitled "A Method and Apparatus For Two Dimensional Filtering in a Communications System Using a Transformer System," U.S. application Ser. No. 09/436,144 entitled "Cavity-Driven Antenna System," U.S. application Ser. No. 09/437,892 entitled "Disc Antenna System," and U.S. application Ser. No. 09/436,400 entitled "Two-Dimensional Amplifier."

BACKGROUND OF THE INVENTION

The present invention relates to the field of communications, and more particularly to a system for measuring and displaying three-dimensional characteristics of electromagnetic waves.

Presently, an electromagnetic (EM) wave can be received by a dipole antenna and the resulting electrical signal representing the EM wave can be displayed using test equipment, such as an oscilloscope or a spectrum analyzer. The oscilloscope can provide a display of the amplitude of the received EM wave as a function of time, while the spectrum analyzer can provide a display of the spectral content of the wave (i.e., amplitude of the wave as a function of frequency). However, it is possible to generate three-dimensional EM waves, for example, as described in the copending application. Moreover, using a single dipole (or other conventional antenna) and conventional test equipment to measure and display such a three-dimensional EM wave can result in a loss of EM wave information (e.g., a loss of spatial information) and/or provide an inaccurate display of the EM wave.

As a result, there is a need for equipment that more effectively measures and displays three-dimensional characteristics of EM waves.

SUMMARY OF THE INVENTION

According to the embodiments of the present invention, measurement systems are provided which measure and display various three-dimensional characteristics of an EM wave.

A measurement system includes a receiver system and a display system. The receiver system receives one or more electromagnetic (EM) waves each having a carrier frequency and a rotation frequency. The receiver system determines an amplitude for each EM wave. The display system displays the amplitude for each EM wave as a function of carrier frequency and rotation frequency. Another measurement system measures and displays the angular position or orientation and amplitude of the E field of a received EM wave as a function of time.

DETAILED DESCRIPTION

The measurement systems of the present invention can be used to measure and display various three-dimensional characteristics of electromagnetic (EM) waves.

One type of three-dimensional EM wave is described in detail in the copending application. An information modulated EM wave has a carrier frequency and an electric (E) field vector the extremity of which traces a non-linear periodic path at a frequency that is less than the carrier frequency. In other words, the extremity of the E field vector traces a predictable path whose rate of change about the axis of propagation (or rotation frequency) is less than the carrier frequency of the wave. (Note that the EM wave "rotates" about the axis of propagation in a very specific sense with respect to a rosette pattern, as described in detail in the copending application). (In conventional EM waves, the E field rotation frequency is the same as the carrier frequency). A unique combination of carrier frequency and rotation frequency can define a unique communications channel for carrying information. (Note that only one of the carrier frequency or the rotation frequency needs to be different to define different communications channels).

Figure 1:
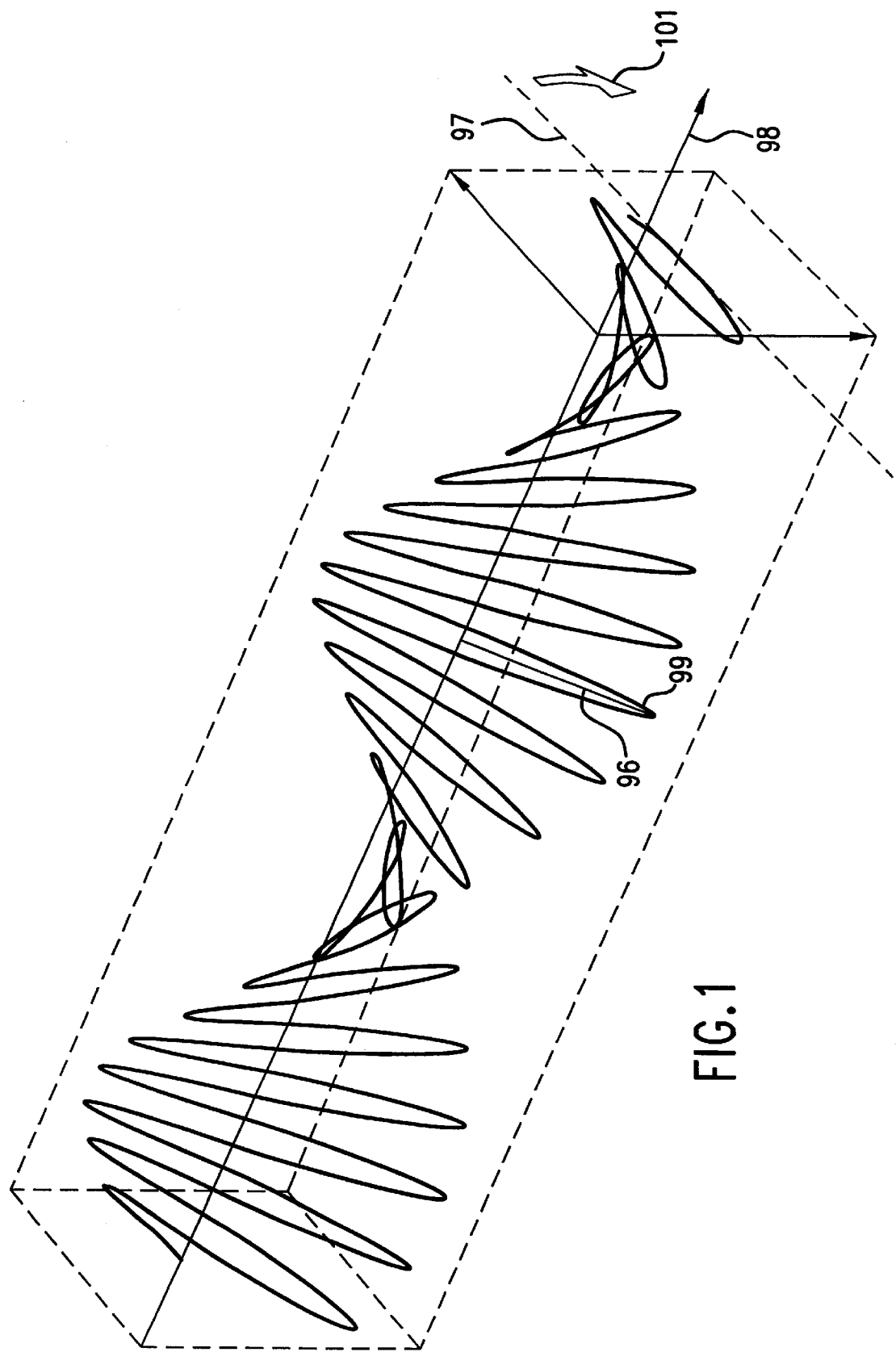
FIG. 1 illustrates the path traced by the extremity of an electric (E) field of a wave according to an embodiment of the present invention.

Referring to the drawings in detail, wherein like numerals indicate like elements, FIG. 1 illustrates the path traced by the extremity of an electric (E) field of a wave according to an embodiment of the present invention where the E-field of the wave rotates about the axis of propagation 98 at a rotation frequency less than the carrier frequency. As described in detail in the copending application, the terminus 99 of the E-field vector 96 traces a rosette-shaped path (rosette-shaped path not shown in FIG. 1). The non-linear path traced about the axis of propagation 98 can alternatively be described in reference to an orientation line 97. Orientation line 97 indicates the angular position of the E-field with respect to the axis of propagation 98. For example, orientation line rotates in the direction of arrow 101, as described in detail in the copending application. The measurement systems of the present invention measure and display characteristics of such three-dimensional waves.

Figure 2:
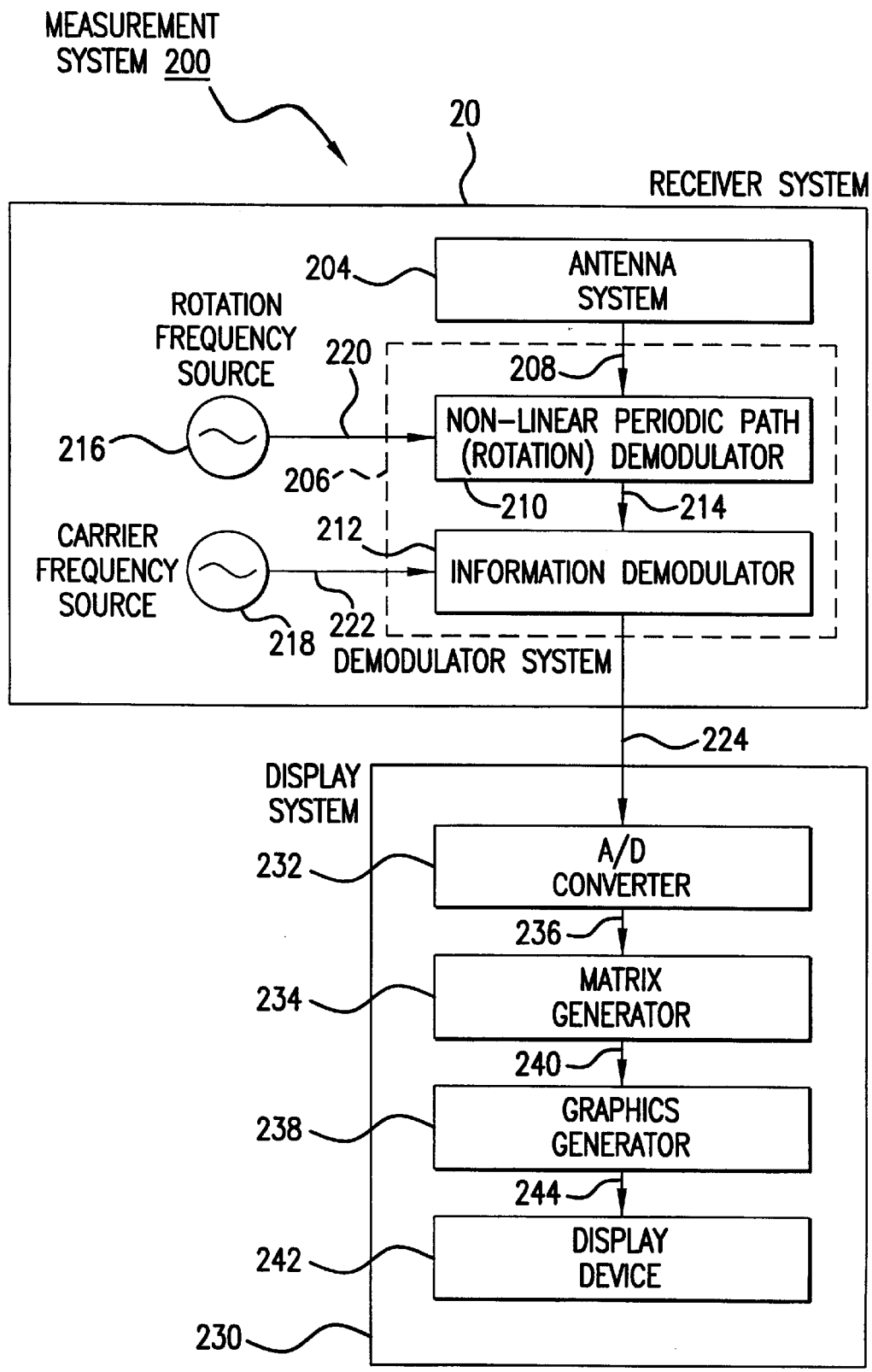
FIG. 2 is a block diagram of a measurement system according to an embodiment of the present invention.

FIG. 2 is a block diagram of a measurement system according to an embodiment of the present invention. Measurement system 200 includes a receiver system 202 and a display system 230 coupled via line 224. Receiver system 202 receives one or more electromagnetic (EM) waves each having a carrier frequency and a rotation frequency.

Receiver system 202 measures or determines an amplitude for each EM wave (e.g., measures the amplitude of an information signal transmitted by the EM wave). Display system 230 displays the amplitude for each EM wave as a function of carrier frequency and rotation frequency.

According to an embodiment of the present invention, each received EM wave is related to an information signal modulated onto a carrier frequency, an electric (E) field vector of each received EM wave rotates about an axis of propagation of the wave at a rotation frequency that is less than the carrier frequency. Each unique combination of carrier frequency and rotation frequency can define a different communications channel for carrying at least one corresponding information signal.

Receiver system 202 includes an antenna system 204 for receiving EM waves and producing, for example, a modulated information signal corresponding to each EM wave. A demodulator system 206 is coupled to the antenna system 204 via line 208. A rotation frequency signal source 216 is coupled to demodulator system 206 via line 220 and produces a variable rotation frequency signal. A carrier frequency signal 20 source 218 is coupled to demodulator system 206 via line 222 and produces a variable carrier frequency signal. Sources 216 and 218 can be any suitable sources, such as a variable sine wave generator. Demodulator system 206 produces an information signal corresponding to each EM wave, based on a modulated information signal from antenna system 204, the rotation frequency signal received via line 220, and the carrier frequency signal received via line 222.

Demodulator system 206 includes a non-linear periodic path (or rotation) demodulator 210 and an information demodulator 212, coupled together via line 214. Non-linear periodic path 210 demodulator produces a modulated information signal (e.g., a baseband information signal that was modulated onto a carrier frequency) on line 214 based on the rotation frequency signal received via line 220. The rotation frequency signal received on line 220 from source 216 is adjusted to match the rotation frequency of the signal received via line 208 to produce a modulated information signal on line 214. Information demodulator 212 produces the information signal based on the modulated information signal (received via line 214) and a carrier frequency signal. The carrier frequency signal from source 218 is adjusted to match the carrier frequency of the signal received via line 214.

In addition, the rotation frequency source 216 and carrier frequency source 218 can "sweep" (or step) through many different rotation and carrier frequencies, respectively (in different combinations) to demodulate and measure the amplitudes of a plurality of the received EM waves (or the information signals received on different communications channels).

Receiver system outputs an information signal (e.g., an analog signal) on line 224 corresponding to the demodulated signal (selected by adjusting sources 216 and 218 to the appropriate carrier and rotation frequencies). The signal on line 224 can indicate the amplitude or level of the demodulated signal. If sources 216 and 218 sweep through different rotation and carrier frequencies, respectively, output signal 224 will briefly include amplitude information for each selected information signal (or each selected EM wave or communications channel). Changes in the rotation or carrier frequencies from sources 216 and 218 result in demodulation of different information signals, and the output of the corresponding amplitude values for the information signal of each selected communications channel.

Display system 230 displays the amplitude of each EM wave as a function of carrier frequency and rotation frequency. Display system comprises an A/D converter 232 for converting the amplitude values from an analog format to a digital format. A matrix generator 234 is coupled to the A/D converter via line 236. Matrix generator 234 generates a matrix or table of the amplitudes or levels of the information signal of each received EM wave as a function of carrier frequency and rotation frequency. A graphics generator 238 is coupled to the matrix generator 234 via line 240 and generates a graphics signal based on the output of the matrix generator 234. A display device 242 is coupled via line 244 to the graphics generator 238 and graphically displays the amplitudes of the information signal of each received EM wave as a function of carrier frequency and rotation frequency. According to an embodiment of the present invention, software entitled "Labview," available from National Instruments, Austin, Tex., can be used in place of matrix generator 234 and graphics generator 238. Labview can be used for data acquisition, analysis and presentation.

Table 1 illustrates an example of the table or matrix of values generated by matrix generator 234.

TABLE 1

| Amplitude | Carrier Frequency (MHZ) | Rotation Frequency (MHZ) |
|---|---|---|
| (ch. 1) 2 | 680 | .1 |
| (ch. 2) 1 | 725 | 25 |
| (ch. 3) 2 | 725 | 30 |

Table 1 includes amplitude data for three EM waves (three communication channels). The amplitudes are provided for three communications channels (e.g., three EM waves) as a function of carrier frequency and rotation frequency.

Figure 3:
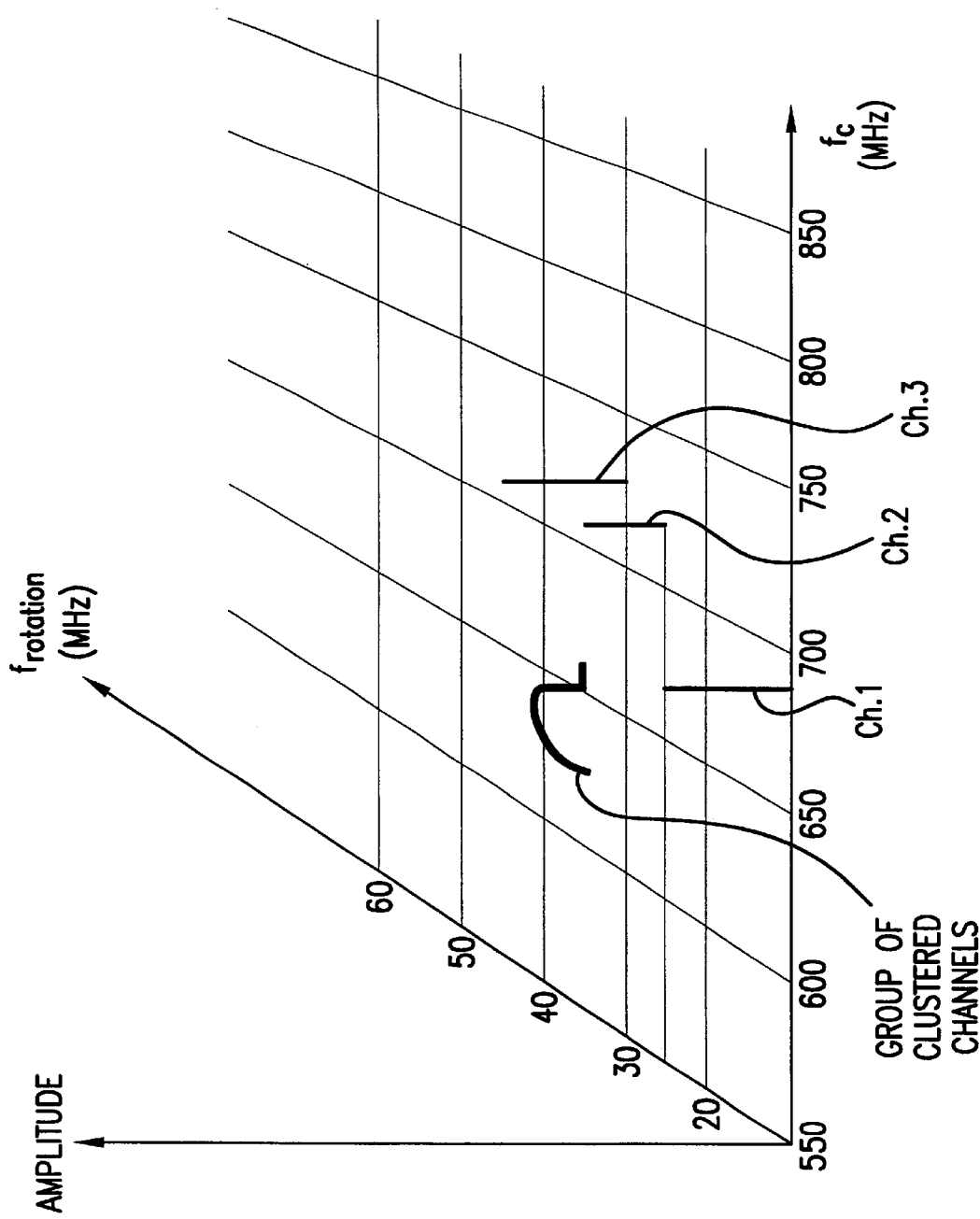
FIG. 3 is a diagram illustrating a graphical display of the amplitude of several information signals as a function of carrier frequency and rotation frequency according to an embodiment of the present invention.

FIG. 3 is a diagram illustrating a graphical display of the amplitude of several information signals as a function of carrier frequency and rotation frequency according to an embodiment of the present invention. Referring to Table 1 and FIG. 3, amplitude data is provided for three communication channels (three unique combinations of carrier and rotation frequencies). Channel 1 illustrates an amplitude of 2 and having a carrier frequency of 680 MHZ, and a rotation frequency of 100 KHz. Channel 2 illustrates an amplitude of 1 and having a carrier frequency of 725 MHZ and a rotation frequency of 25 MHZ. Channel 3 has an amplitude of 2, with a carrier frequency of 725 MHZ, and a rotation frequency of 30 MHZ. FIG. 3 also illustrates a group of clustered communication channels, where several signals are located on several nearby or adjacent frequencies. The clustered signals can be displayed as a type of three-dimensional mountain range or a similar display. Note that the display of FIG. 3 is three-dimensional in that amplitude is illustrated as a function of both carrier frequency and rotation frequency.

Figure 4:
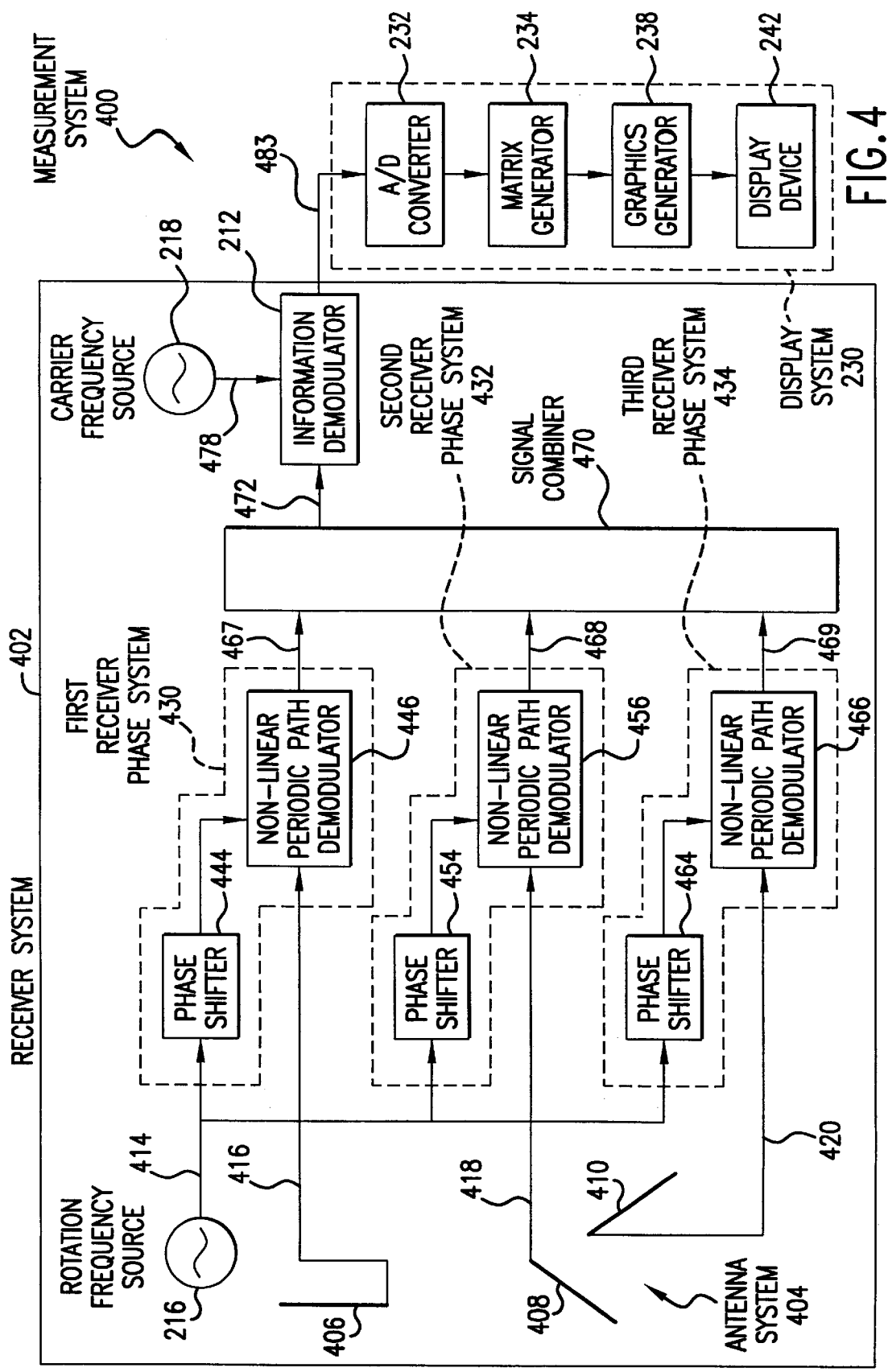
FIG. 4 is a block diagram illustrating a measurement system according to another embodiment of the present invention.

FIG. 4 is a block diagram illustrating a measurement system according to another embodiment of the present invention. Measurement system 400 includes a receiver system 402 and a display system 230. Receiver system 402 comprises an antenna system 404, including antenna elements 406, 408 and 410. Receiver system 402 also includes a first receiver phase system 430 (including a phase shifter 444 and a non-linear periodic path demodulator 446), a second receiver phase system 432 (including a phase shifter 454 and a non-linear periodic path demodulator 456) and a third receiver phase system 434 (including a phase shifter 464 and a non-linear periodic path demodulator 466). Each phase shifter is coupled to rotation frequency source 216 via line 414. A signal combiner 470 is coupled to non-linear periodic path demodulators 446, 456 and 466 via lines 467, 468 and 469, respectively. An information demodulator 212 is coupled to signal combiner 470 via line 472, and to carrier frequency source 218 via line 478. A display system 230 is coupled to information demodulator 212 via line 483. As described above, display system 230 includes an A/D converter 232, a matrix generator 234, a graphics generator 238 and a display device 242.

Antenna system 404 receives an electromagnetic (EM) wave having a carrier frequency and a rotation frequency. Each antenna element 406, 408 and 410 produces a modulated information signal corresponding to the received EM wave. Antenna elements 406, 408 and 410 output their respective modulated information signals to non-linear periodic path demodulators 446, 456 and 466 via lines 416, 418 and 420, respectively. One phase system corresponds to each antenna element. Each phase shifter 444, 454 and 464 produces a phase shifted rotation frequency signal in response to the rotation frequency signal. Each phase shifter shifts the rotation frequency signal a different amount from other phase shifters corresponding to relative angular orientation of antenna elements 406, 408 and 410. Each nonlinear periodic path demodulator produces a phase shifted modulated information signal based on said modulated information signal and the phase shifted rotation frequency signal. Combiner 470 sums the outputs from each of the receiver phase systems 430, 432 and 434 to produce a combined modulated information signal, output on line 472. Information demodulator 212 produces an information signal corresponding to the received EM wave based on the combined modulated information signal and the carrier frequency signal. Display system 230 displays the amplitude of the information signal as a function of carrier frequency and rotation frequency.

Figure 5:
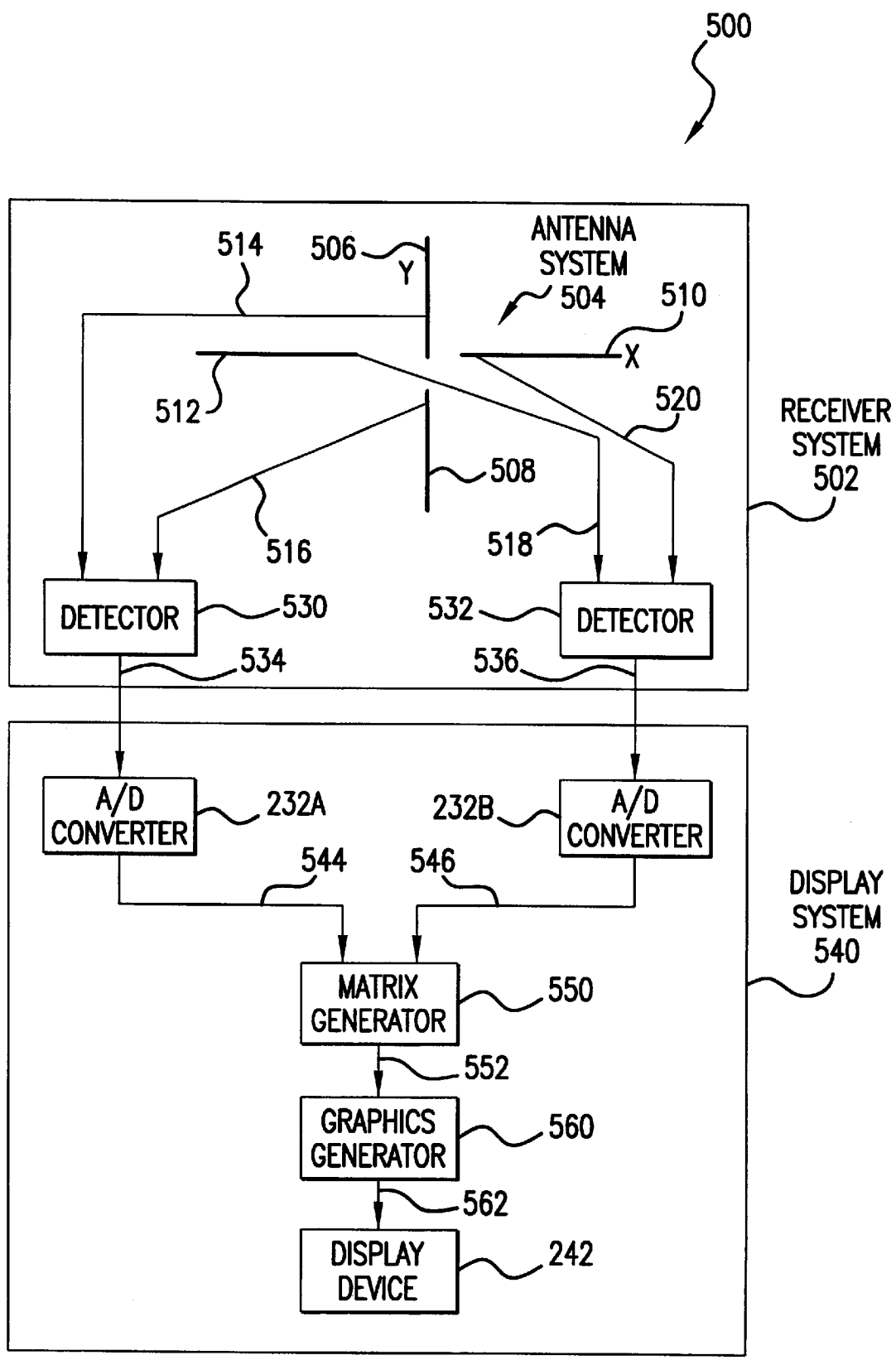
FIG. 5 is a block diagram illustrating a measurement system according to yet another embodiment of the present invention.

FIG. 5 is a block diagram illustrating a measurement system according to yet another embodiment of the present invention. A measurement system 500 is provided for measuring and displaying an angular direction or orientation and amplitude of an electric (E) field as a function of time.

Measurement system 500 includes a receiver system 502 and a display system 540. Receiver system 502 receives an electromagnetic (EM) wave having an electric (E) field and determines or measures an angular position or orientation and an amplitude of the E-field as a function of time. Display system 540 is coupled to receiver system 502 and displays the angular position or orientation and amplitude of the E-field as a function of time.

Receiver system 502 comprises an antenna system 504 receiving the EM wave. Antenna system 504 includes a plurality of antenna elements, such as dipoles or the like. Each antenna element produces an electrical signal corresponding to the E-field of the received EM wave. As shown in FIG. 5, antenna system 504 includes dipoles 506 and 508 oriented in the Y-direction, and dipoles 510 and 512 oriented in the X-direction. The two X direction dipoles 510 and 512 generate X components of the E-field and are coupled to a detector 530. The two Y direction dipoles 506 and 508 generate Y components of the E-field and are coupled to detector 532.

Detectors 530 and 532 can be any conventional detectors, such as an envelope detector, a synchronous detector or the like. Detectors 532 and 530 detect the amplitude of the E-field in the X and Y directions. The amplitudes of the E-field signals from dipoles 506 and 508 are summed by detector 530 to obtain to total E-field component in the Y direction. In an alternative embodiment, two detectors (to detect the amplitude of signals from each dipole) followed by an amplitude summer may be used in place of detector 530.

The amplitudes of the E-field signals from dipoles 510 and 512 are summed by detector 532 to obtain the total E-field component in the X direction. (Two detectors and a summer may also be used in place of detector 532).

Because two of the dipoles in FIG. 5 are oriented orthogonally to the other two dipoles, the resulting components of the E-field are also orthogonal to each other (e.g., $E_X$ and $E_Y$). The antenna elements, however, need not be oriented orthogonally. Also, antenna system 504 need not generate E-field components which are orthogonal to one another. If a display of the E-field orientation is provided using a Cartesian coordinate system (e.g., X, Y), a conversion from non-orthogonal E-field components to orthogonal components can be provided by either using software (after converting the data to a digital format) or using other well known techniques.

Display system 540 includes A/D converters 232A and B for converting the E-field amplitude data from analog to digital format. A matrix generator 550 is coupled to the A/D converters 232. The matrix generator 550 generates a matrix or table of the angular position or orientation and an amplitude of the E-field as a function of time. The orientation of the E-field (at a particular time)is defined by the $E_x$ and $E_y$ amplitude values, defining the location of the terminus of the E-field vector of the wave in the X-Y plane. The particular time at which the E-field was measured or sampled defines the terminus of the E-field vector in the Z plane (corresponding to time). As a result, the X and Y amplitude values and time values stored in memory by the matrix generator 550 can define the orientation and amplitude of the E-field. Vector summation can be used to obtain to overall amplitude of the E-field based on the X and Y components. Several measurements of the E-field should be taken at different times to obtain an accurate picture of the path traced by the terminus of the E-field.

Table 2 illustrates an example of the X and Y amplitude values and time values of different E-field measurements or samples stored in the matrix.

TABLE 2

| X, Y | Time (seconds) |
|---|---|
| −1, 1 | .2 |
| 0, 2 | .4 |
| 1, 1 | .6 |
| 3, 1 | .8 |

A graphics generator 560 is coupled to the matrix generator 550 and generates a graphics signal based on the output of the matrix generator 550. A display device 242 is coupled to the graphics generator and graphically displays the angular position or orientation and an amplitude of the E-field as a function of time.

Figure 6:
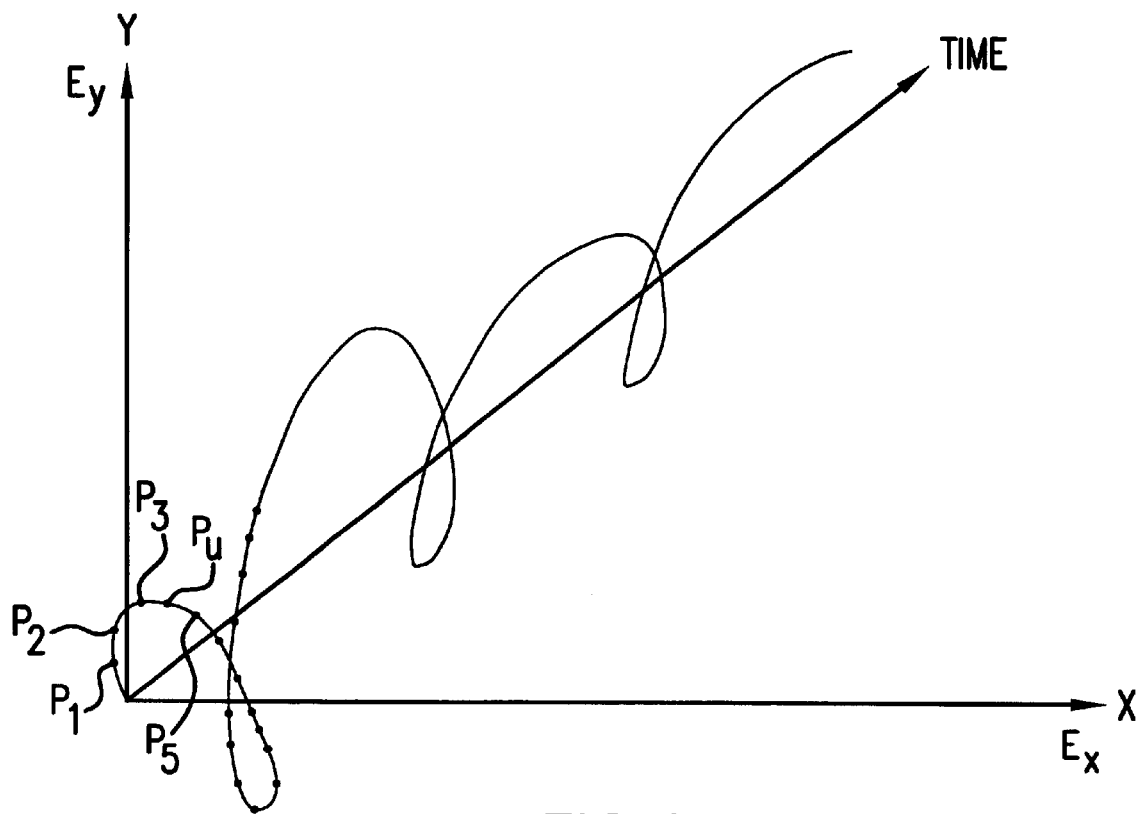
FIG. 6 is a diagram illustrating an example display of the orientation of the E field as a function of time according to an embodiment of the present invention.

FIG. 6 is a diagram illustrating an example display of the orientation of the E-field as a function of time according to an embodiment of the present invention. FIG. 6 includes an X axis indicating the amplitude of the X component of the E-field, a Y axis indicating the amplitude of the Y component of the E-field. Time is provided along the Z axis. The E-field (including X and Y components) is measured at various points in time. The measurement points are shown in FIG. 6 as P1, P2, P3, P4 and P5. Many additional measurement points can also be taken. The amplitude and time data for each of these points is stored in memory by matrix generator 550. Graphics generator generates a graphics signal based on the matrix data, which is displayed onto display device 242. FIG. 6 is an example of a graphical display which can be provided on display device 242.

Several embodiments of the present invention are specifically illustrated and/or described herein. However, it will be appreciated that modifications and variations of the present invention are covered by the above teachings and within the purview of the appended claims without departing from the spirit and intended scope of the invention. For example, various types of demodulators can be used in place of detectors 530 and 532.

What is claimed is:

1. A measurement system comprising:
    a receiver system, said receiver system receiving one or more electromagnetic (EM) waves each having a carrier frequency and a rotation frequency, the receiver system determining an amplitude for each EM wave; and
    a display system coupled to the receiver system, said display system displaying the amplitude for each EM wave as a function of carrier frequency and rotation frequency.

2. The measurement system of claim 1 wherein the rotation frequency is less than the carrier frequency.

3. The measurement system of claim 1 wherein each EM wave corresponds to an information signal modulated onto a carrier frequency, an electric (E) field vector of each received EM wave rotating about an axis of propagation of the wave at a rate equal to the rotation frequency, each unique combination of carrier frequency and rotation frequency defining a communications channel for carrying a corresponding information signal.

4. The measurement system of claim 3 wherein said receiver system comprises:
    an antenna system receiving the plurality of EM waves, the antenna system producing a modulated information signal corresponding to each EM wave;
    a demodulator system coupled to the antenna system, the demodulator system producing an information signal corresponding to each EM wave.

5. The measurement system of claim 4, further comprising a rotation frequency source coupled to said receiver system, said rotation frequency source producing a variable rotation frequency signal, and a carrier frequency source coupled to said receiver system, said carrier frequency source producing a variable carrier frequency signal.

6. The system of claim 5 wherein the demodulator system produces an information signal corresponding to one of the EM waves by demodulating the modulated information signal using the carrier frequency signal having a frequency equal to the carrier frequency of the information signal and by using the rotation frequency signal having a frequency equal to the rotation frequency of the corresponding EM wave.

7. The system of claim 6 wherein said rotation frequency source and the carrier frequency source are varied to demodulate the modulated information signal for each of the received EM waves or communications channels.

8. A measurement system comprising:
    an antenna system receiving one or more electromagnetic (EM) waves each having a carrier frequency and a rotation frequency, each EM wave corresponds to an information signal modulated onto a carrier frequency, an electric (E) field vector of each received EM wave rotating about an axis of propagation of the wave at a rate equal to a rotation frequency, each unique combination of carrier frequency and rotation frequency defining a communications channel for carrying a corresponding information signal, the antenna system producing a modulated information signal corresponding to each received EM wave;
    a rotation frequency source producing a variable rotation frequency signal;
    a carrier frequency source producing a variable carrier frequency signal;
    a demodulator system coupled to the antenna system, the carrier frequency source and the rotation frequency source, said demodulator system producing an information signal corresponding to each received EM wave based on a selected frequency of the rotation frequency signal and a selected frequency of the carrier frequency signal;
    a display system coupled to the demodulator system displaying amplitude of the information signal of each EM wave as a function of the carrier frequency and the rotation frequency.

9. The system of claim 8 wherein said display system comprises:
    an A/D converter coupled to the information signal demodulator and converting the information signal from an analog to a digital format;
    a matrix generator coupled to the A/D converter, said matrix generator generating a matrix or table of the amplitudes or levels of the information signal of each received EM wave as a function of carrier frequency and rotation frequency;
    a graphics generator coupled to the matrix generator, said graphics generator generating a graphics signal based on the output of the matrix generator; and
    a display device coupled to the graphics generator and graphically displaying the amplitudes of the information signal of each received EM wave as a function of carrier frequency and rotation frequency.

10. A measurement system comprising:
    an antenna system comprising a plurality of antenna elements, the antenna system receiving an electromagnetic (EM) wave having a carrier frequency and a rotation frequency, the EM wave corresponding to an information signal modulated onto a carrier frequency, an electric (E) field vector of the received EM wave rotating about an axis of propagation of the wave at a rate equal to the rotation frequency, the rotation frequency being less than the carrier frequency, each said antenna element producing a modulated information signal corresponding to the received EM wave;
    a rotation frequency source producing a rotation frequency signal;
    a plurality of phase systems coupled to the antenna system and the rotation frequency source, each said phase system corresponding to one of the antenna elements and receiving the modulated information signal produced by a corresponding antenna element, each said phase system including,
        a phase shifter producing a phase shifted rotation frequency signal in response to said rotation frequency signal, each phase shifter shifting the rotation frequency signal a different amount from other phase shifters; and a non-linear periodic path demodulator coupled to the corresponding phase shifter and outputting a demodulated phase shifted information signal based on said modulated information signal and the phase shifted rotation frequency signal;

a combiner summing the phase shifted modulated information signals output from each said phase system to produce a combined modulated information signal;

a carrier frequency source producing a carrier frequency signal;

an information demodulator producing an information signal corresponding to the received EM wave based on the combined modulated information signal and the carrier frequency signal; and a display system coupled to the information demodulator and displaying the amplitude of the information signal as a function of carrier frequency and rotation frequency.

11. A measurement system comprising:

a receiver system, said receiver system receiving an electromagnetic (EM) wave having an electric (E) field, the receiver system determining an angular position or orientation and an amplitude of the E-field as a function of time; and a display system coupled to the receiver system, said display system displaying the angular position or orientation and amplitude of the E-field as a function of time.

12. The measurement system of claim 11 wherein said display system comprises:

a plurality of A/D converters, each converter coupled to an output of the receiver system;

a matrix generator coupled to the A/D converters, said matrix generator generating a matrix or table of the angular position or orientation and an amplitude of the E-field as a function of time;

a graphics generator coupled to the matrix generator, said graphics generator generating a graphics signal based on the output of the matrix generator; and a display device coupled to the graphics generator and graphically displaying the angular position or orientation and an amplitude of the E-field as a function of time.

13. A measurement system comprising:

a receiver system, said receiver system receiving an electromagnetic wave (EM) wave having an electric (E) field, said receiver system determining an angular position or orientation and an amplitude of the E-field as a function of time, said receiver system including an antenna system receiving the EM wave, said antenna system comprising a plurality of antenna elements, and a plurality of detectors, each detector coupled to one or more of said antenna elements, each detector detecting a component of the E-field; and a display system coupled to the receiver system, said display system displaying the angular position or orientation and amplitude of the E-field as a function of time.

* * * * *